(12) United States Patent
Sinha

(10) Patent No.: US 7,981,221 B2
(45) Date of Patent: Jul. 19, 2011

(54) RHEOLOGICAL FLUIDS FOR PARTICLE REMOVAL

(75) Inventor: Nishant Sinha, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 562 days.

(21) Appl. No.: 12/035,008

(22) Filed: Feb. 21, 2008

(65) Prior Publication Data

US 2009/0211595 A1    Aug. 27, 2009

(51) Int. Cl.
*B08B 3/10* (2006.01)

(52) U.S. Cl. ............ 134/1.3; 134/4; 134/10; 134/42; 252/62.51 R; 252/73; 451/35; 451/38; 204/242

(58) Field of Classification Search ............ 134/1, 1.3, 134/42, 4, 40; 252/62.51 R, 73; 204/242; 451/35, 38
See application file for complete search history.

(56) References Cited

U.S. PATENT DOCUMENTS

| | | | |
|---|---|---|---|
| 2,417,850 A * | 3/1947 | Winslow | 361/207 |
| 3,150,678 A | 9/1964 | Nuber | |
| 3,197,682 A * | 7/1965 | Martinek et al. | 361/234 |
| 3,309,915 A * | 3/1967 | McEuen et al. | 73/654 |
| 4,033,892 A * | 7/1977 | Stangroom | 252/76 |
| 4,129,513 A * | 12/1978 | Stangroom | 252/78.1 |
| 4,687,589 A * | 8/1987 | Block et al. | 252/73 |
| 4,864,461 A | 9/1989 | Kasahara | |
| 4,999,954 A * | 3/1991 | Miyamoto et al. | 451/5 |
| 5,032,307 A * | 7/1991 | Carlson | 252/73 |
| 5,054,593 A | 10/1991 | Carlson | |
| 5,213,713 A * | 5/1993 | Reitz | 252/500 |
| 5,277,281 A | 1/1994 | Carlson et al. | |
| 5,336,426 A * | 8/1994 | Rader et al. | 510/195 |
| 5,374,367 A | 12/1994 | Edamura et al. | |
| 5,382,373 A | 1/1995 | Carlson et al. | |
| 5,449,313 A * | 9/1995 | Kordonsky et al. | 451/35 |
| 5,496,174 A * | 3/1996 | Garner | 434/114 |
| 5,496,484 A * | 3/1996 | Shima et al. | 252/74 |
| 5,503,763 A | 4/1996 | Podszun et al. | |
| 5,507,967 A | 4/1996 | Fujita et al. | |
| 5,516,445 A | 5/1996 | Sasaki et al. | |
| 5,523,157 A | 6/1996 | Sasaki et al. | |
| 5,577,948 A * | 11/1996 | Kordonsky et al. | 451/35 |
| 5,651,834 A * | 7/1997 | Jon et al. | 134/31 |
| 5,702,630 A | 12/1997 | Sasaki et al. | |
| 5,854,962 A * | 12/1998 | Boockholdt et al. | 399/343 |

(Continued)

FOREIGN PATENT DOCUMENTS

EP    1065708 A2    1/2001

(Continued)

OTHER PUBLICATIONS

Ricci, Anthony. 'Removing Particulate Contamination in Ultra High Pure Gas Delivery Systems by Installing Pall Gas Filters' 2005. Pall Corporation, New York.*

(Continued)

*Primary Examiner* — Michael Kornakov
*Assistant Examiner* — Katelyn B Whatley
(74) *Attorney, Agent, or Firm* — Whyte Hirschboeck Dudek SC

(57) ABSTRACT

Methods and apparatus for cleaning a substrate (e.g., wafer) in the fabrication of semiconductor devices utilizing electrorheological (ER) and magnetorheological (MR) fluids to remove contaminant residual particles from the substrate surface are provided.

23 Claims, 7 Drawing Sheets

U.S. PATENT DOCUMENTS

| | | | |
|---|---|---|---|
| 5,879,582 A * | 3/1999 | Havelka et al. | 252/77 |
| 5,891,356 A | 4/1999 | Inoue et al. | |
| 5,931,721 A | 8/1999 | Rose et al. | |
| 5,971,835 A * | 10/1999 | Kordonski et al. | 451/38 |
| 5,976,264 A | 11/1999 | McCullough et al. | |
| 6,048,405 A | 4/2000 | Skrovan et al. | |
| 6,220,935 B1 * | 4/2001 | Furusawa et al. | 451/38 |
| 6,269,511 B1 * | 8/2001 | Andreas et al. | 15/77 |
| 6,277,306 B1 * | 8/2001 | Endo et al. | 252/572 |
| 6,277,753 B1 | 8/2001 | Mullee et al. | |
| 6,280,658 B1 | 8/2001 | Atarashi et al. | |
| 6,530,217 B1 | 3/2003 | Yokota et al. | |
| 6,598,465 B2 | 7/2003 | Shin et al. | |
| 6,647,611 B2 * | 11/2003 | Zhang | 29/559 |
| 6,663,719 B2 * | 12/2003 | Shinozaki et al. | 134/1 |
| 6,682,660 B2 | 1/2004 | Sucholeiki et al. | |
| 6,776,171 B2 * | 8/2004 | Carpenter et al. | 134/1.3 |
| 6,797,202 B2 * | 9/2004 | Endo et al. | 264/5 |
| 6,818,143 B2 | 11/2004 | Iyengar | |
| 6,852,251 B2 | 2/2005 | Sheng et al. | |
| 6,984,343 B1 | 1/2006 | Wen et al. | |
| 7,129,573 B2 * | 10/2006 | Hiatt et al. | 257/690 |
| 7,135,444 B2 | 11/2006 | Yates et al. | |
| 7,137,496 B2 | 11/2006 | Sheng et al. | |
| 7,217,372 B2 | 5/2007 | Kintz et al. | |
| 7,288,075 B2 | 10/2007 | Parihar et al. | |
| 2001/0037821 A1 * | 11/2001 | Staley et al. | 134/25.4 |
| 2002/0079176 A1 * | 6/2002 | Anderson | 188/290 |
| 2002/0153647 A1 | 10/2002 | Baudendistel et al. | |
| 2003/0004075 A1 * | 1/2003 | Suto et al. | 510/175 |
| 2003/0109394 A1 * | 6/2003 | Ruhr et al. | 510/202 |
| 2003/0116176 A1 * | 6/2003 | Rothman et al. | 134/1.3 |
| 2003/0143857 A1 * | 7/2003 | Andreas | 438/710 |
| 2004/0232378 A1 | 11/2004 | Suh et al. | |
| 2005/0017943 A1 | 1/2005 | Weisbuch et al. | |
| 2005/0173377 A1 * | 8/2005 | Pietsch et al. | 216/88 |
| 2005/0211525 A1 | 9/2005 | Sheng et al. | |
| 2005/0255360 A1 | 11/2005 | Post et al. | |
| 2006/0000495 A1 * | 1/2006 | Brown | 134/42 |
| 2006/0063681 A1 * | 3/2006 | Christanti et al. | 507/203 |
| 2006/0076040 A1 | 4/2006 | Moore et al. | |
| 2006/0128600 A1 * | 6/2006 | Freer et al. | 510/491 |
| 2006/0144286 A1 * | 7/2006 | Baum | 106/18 |
| 2006/0248750 A1 | 11/2006 | Rosenberg | |
| 2006/0252354 A1 * | 11/2006 | Arana et al. | 451/28 |
| 2006/0272677 A1 * | 12/2006 | Lee et al. | 134/3 |
| 2007/0000518 A1 * | 1/2007 | Korolik et al. | 134/3 |
| 2007/0023247 A1 * | 2/2007 | Ulicny et al. | 192/21.5 |
| 2007/0084483 A1 * | 4/2007 | Freer et al. | 134/6 |
| 2007/0084485 A1 * | 4/2007 | Freer et al. | 134/26 |
| 2008/0296530 A1 * | 12/2008 | Fuchs et al. | 252/62.54 |
| 2009/0156452 A1 * | 6/2009 | Mui et al. | 510/175 |
| 2009/0305868 A1 * | 12/2009 | Kutushov | 502/5 |
| 2010/0043824 A1 * | 2/2010 | Greeley et al. | 134/3 |
| 2010/0171065 A1 * | 7/2010 | Shen et al. | 252/62.56 |
| 2010/0229890 A1 * | 9/2010 | Sabba et al. | 134/4 |

FOREIGN PATENT DOCUMENTS

| | | |
|---|---|---|
| EP | 1389496 A1 | 2/2004 |
| WO | 9511956 A1 | 10/1993 |

OTHER PUBLICATIONS

National Industrial Competitiveness through Energy, Environment and Economics (NICE3). 'SO3 Cleaning Process in Semiconductor Manufacturing' Jan. 1999. Washington, DC.*

Electrorheological Fluid, http://en.wikipeclia.org/wiki/Electrorheological_fluid; Jun. 25, 2007.

Magnetorheological Fluid, http://en.wikipedia.org/wiki/Magnetorheological_fluid; Feb. 12, 2008.

What is Magneto-Rheological (MR) Fluid?; http://www.lord.com/Home/MagnetoRheologicalMRFluid/MRFluidTechnology/WhatisMr/tabid/3772/; Feb. 12, 2008.

Department of Physics; Electrorheological (ER) fluids; http://web.phys.ust.hk/index.php? option=com_content&task=view&id=88&Itemid=79; Feb. 12, 2008.

Introduction to Electrorheology and Magnetorheology; http://homepages.cae.wisc.edu/—klingen/group/ermrintro.htm; Apr. 26, 2007.

What is Magnetorheological Fluid?; http://www.tech-faq.com/magnetorheological-fluid.shtml; Feb. 12, 2008.

Benjamin Craig; The AMPTIAC Quarterly, vol. 7, No. 2, pp. 15-19. 2003.

Dassanayake, et al.; Physical Review E., 69, 021507-1 to 021507-7, 2004.

Espin, et al.; J. Non-Newtonian Fluid Mech., 125, 1-10, 2005.

Guegan, et al., Chemical Physics, arxiv.org/pdf/physics/0607158, Jul. 2006.

Inoue, et al., Journal of Applied Science, vol. 55, 113-118 (1995).

Negita, et al., J. Phys. II France 5, pp. 883-892, Jun. 1995.

Jennifer Ouellette, The Industrial Physicist, pp. 14-17, Dec. 2003/Jan. 2004.

Park et al., Korea-Australia Rheology Journal, vol. 13, No. 1, pp. 13-17, Mar. 2001.

Radcliffe, et al., State Feedback Control of Electrorheological Fluids, 1996 ASME International Congress and Exhibition, Nov. 17-22, 1996, Atlanta Georgia, pp. 1-8.

Tse, et al., Macromolecules, 33, pp. 3134-3141, 2000.

Guangqiang Yang, Large-Scale Magnetorheological Fluid Damper for Vibration Mitigation: Modeling, Testing and Control, http://cee.uiuc.edu/sstl/gyang2/gyang2_thesis.htm; Apr. 9, 2008.

Ursescu, Ana, Techn. Univ., Darmstadt, Diss., pp. 13-15, 2005.

Choi, H.J., et al., IEEE Transactions on Magnetics, vol. 41, No. 10, 3448-3450, Oct. 2005.

* cited by examiner

US 7,981,221 B2

RHEOLOGICAL FLUIDS FOR PARTICLE REMOVAL

TECHNICAL FIELD

Embodiments of the invention relate to the cleaning of surfaces in the fabrication of semiconductor and integrated circuit devices.

BACKGROUND OF THE INVENTION

Various methods and aqueous cleaning solutions have been used for the removal of small residual particles and contaminants from surfaces, such as a wafer surface in the fabrication of semiconductor-based structures and devices. A post-process clean is typically conducted to remove residual particles remaining on the surface after a processing step such as etching, planarization, polishing, sawing, film deposition, etc., prior to performing another device fabrication step such as a metallization, gate or device formation, etc. If residues or contaminants remaining from a process step are not effectively removed, various fabrication problems and defects in the finished integrated circuit device can arise. For example, conductive residual particles (i.e., metals) that remain on a surface feature can cause such problems as shorts between capacitor electrodes or other electrical failures, and non-conductive contaminants on a feature such as particles (e.g., $SiO_2$, polysilicon, nitride, polymers, etc.) from a chemical mechanical planarization or polishing (CMP) or other process can cause problems such as the failure in adhesion of subsequent layers, a loss of critical dimension of the formed feature, or pattern deformation in that area leading to yield loss. Current technology nodes (e.g., 65 nm and smaller) require a high level of surface cleaning, including the removal of remnant particles while maintaining other surface materials intact. At each technology node, the presence of ¼-pitch remnant particles is considered to be a yield inhibitor.

A widely used cleaning technique to remove surface materials is an RCA clean which conventionally includes first applying an aqueous alkaline cleaning solution known as a Standard Clean 1 (SC1) to remove particle contaminants, which consists of a dilution of ammonium hydroxide/hydrogen peroxide ($NH_4OH/H_2O_2$) followed by a deionized (DI) water rinse. To remove metal contaminants, an aqueous acidic cleaning solution known as a Standard Clean 2 (SC2) composed of a hydrochloric acid/hydrogen peroxide ($HCl/H_2O_2$) dilution is often applied, followed by a second DI water rinse. Other wet cleaning methods used for cleaning residues from structures include, for example, a piranha clean using a sulfuric acid based mixture (e.g., $H_2SO_4/H_2O_2$), a buffered oxide etch solution, and fluorine-based aqueous chemistries.

The small particles or contaminants resulting from fabrication steps are held to a surface such as by electrostatic forces and become entrenched, typically require relatively large forces to remove them. Cleaning solutions are often applied in conjunction with acoustic energy (i.e., ultrasonic or megasonic energy), high pressure spraying techniques, mechanical scrubbing techniques with a pad or brush, etc. to enhance the cleaning action of the solution to remove materials and dislodge particles from the wafer surface. However, acoustic cleaning and spraying techniques apply forces in all directions, which can damage sensitive structures or alter critical dimensions without effectively removing all of the particulate contaminants from the substrate. In addition, many cleaning solutions can attack and/or dissolve the structures formed in the fabrication step.

It is difficult to get acceptable particle removal from a substrate surface without adversely affecting fabricated structures or other surface materials using conventional technologies.

BRIEF DESCRIPTION OF THE DRAWINGS

Embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE INVENTION

Figure 1:
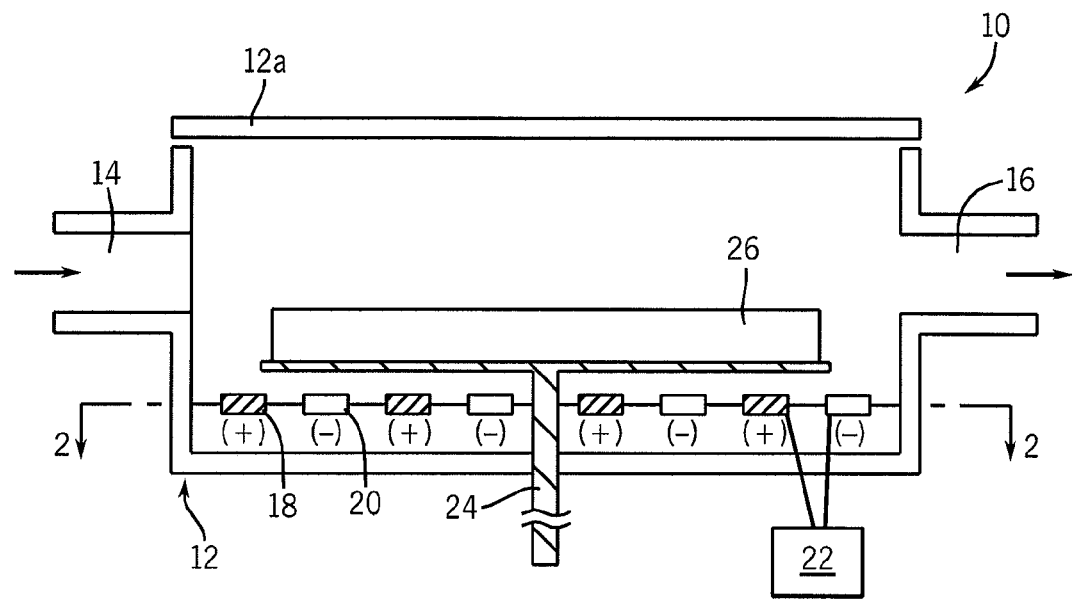
FIG. 1 is a diagrammatic, elevational, cross-sectional view of an embodiment of an apparatus according to the invention for applying an electrorheological (ER) fluid to remove particles from a substrate.

The following description with reference to the drawings provides illustrative examples of devices and methods according to embodiments of the invention. Such description is for illustrative purposes only and not for purposes of limiting the same.

In the context of the current application, the term "semiconductor substrate" or "semiconductive substrate" or "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive substrates, wafer fragments or wafers described above. The phrase "electrorheological (ER) effect" refers to the abrupt change in viscosity in certain suspensions upon application of an electric field.

Embodiments of the present invention relate to methods of cleaning a substrate (e.g., wafer) in the fabrication of semiconductor devices comprising a particle removal process utilizing a fluid that changes viscosity in the presence of an external electric or magnetic field ("Theological fluid"), including electrorheological (ER) and magnetorheological (MR) fluids. Generally, both ER and MR fluids can be composed of a carrier fluid, particles, surfactants and additives. The invention provides the ability to use minimal force for shearing particles from a substrate without damaging fragile structures and features.

In some embodiments of the invention, an electrorheological (ER) fluid is applied, which are fluids that can reversibly undergo a change in Theological (flow) properties (i.e., apparent viscosity) upon the application of a sufficiently powerful electric field, switching from a normal fluid or liquid state to a highly viscous, plastic or semisolid to a solid consistency upon application of an electric field, and back to a fluid state when the electric field is turned off. Generally, the electric field can be either an alternating current (AC), pulsed direct current (DC), or DC, with AC producing less electrophoresis of particles to electrodes. In general, the apparent viscosity of an ER fluid increases in proportion to the strength of an electric field.

In some embodiments, the ER fluid is a heterogeneous dispersion composed of finely divided solids or particles suspended in a non-conducting, electrically insulating carrier or base liquid (e.g., oil) or liquid mixture of low dielectric constant (k). The base liquid is hydrophobic (i.e., totally immiscible in water) and compatible with the materials to be treated, and has a suitable chemical and thermal stability over the temperature range of the application. In embodiments of the invention, the base liquid has a wide temperature range with a low freezing point and a high boiling point (e.g., from about −40° C. to about +200° C.) and a relatively low density. To avoid sedimentation and settling of solids, the base liquid should have a density about equal to the density of the particles. The ER fluid has a suitably low viscosity at room temperature (25° C.) in the absence of an electric field to incorporate a suitable and effective amount of the particulate phase into the fluid phase, e.g., less than about 10 pascal-second (Pa·s), or about 0.1-0.3 Pa·s (about 1-3 poise (P)) but a very high viscosity when subjected to an electric field such that the viscosity is no longer measurable with a near zero rate of flow.

Examples of materials utilized for particle dispersion type ER fluid that can be utilized in embodiments of the invention are described, for example, in U.S. Pat. No. 5,879,582 (Havelka et al.) and US 2007/0023247 (Ulicny) (fluid phase), the disclosures of which are incorporated by reference herein.

Insulating base liquids that can be used in the ER fluid include, for example, silicone oils such as polyalkyl-, polyaryl-, polyalkoxy-, or polyaryloxysiloxane oils and silicate oils (e.g., polydimethyl siloxanes, liquid methyl phenyl siloxanes, tetraethyl silicate, etc.); mineral oils; vegetable oils (e.g., sunflower oils, rapeseed oil and soybean oil); hydrocarbon oils including paraffin oils, naphthalenes, chlorinated paraffins, olefin oligomers and hydrogenated olefin oligomers such as polyisobutylene, ethylene-propylene copolymers, etc.); polyphenylethers; polyesters such as perfluorinated polyesters, dibasic acid esters and neopentylpolyol esters; phosphate esters; glycol esters and ethers such as polyalkylene glycol; aromatic-type oils such as benzoic acid, phthalic acid, etc.; alkylene oxide polymers and interpolymers, and derivatives thereof such as methyl-polyisopropylene glycol; carbon tetrachloride; and chlorofluorocarbons.

The ER particles incorporated into the liquid phase of the ER fluid are capable of exhibiting electrorheological activity (i.e., electrically polarizable). The ER particles can be composed, for example, of inorganic materials such as silica, titanium oxide ($TiO_2$), mica, talc, glass, alumina, magnesium silicate, aluminosilicates, zeolites, etc.; polymeric materials including polymeric salts, poly(lithium methacrylate), poly (sodium styrene sulfonate), etc.; carbohydrate-based particles and related materials such as starch, flour, monosaccharides, and cellulosic materials; metal hydroxides activated with water or polar solvent; and carbonaceous particles (e.g., as described in U.S. Pat. No. 6,797,202). In another embodiment, the particles can be coated with a polymer, for example, polymer-coated iron magnetite. Examples of cellulosic materials include cellulose and cellulose derivatives such as microcrystalline cellulose, amorphous cellulose, cellulose ethers and esters (e.g., methylcellulose, ethyl cellulose, hydroxyethyl cellulose, hydroxypropyl cellulose, cellulose nitrates, sodium carboxymethyl cellulose, cellulose propionate, cellulose butyrate, etc.), cellulose phosphates, chitin, chitosan, chondroiton sulfate, natural gums such as zanthan gum, cellulose xanthate, and the like.

An activator substance such as amines and organic compounds (e.g., thiols, carboxylic acids, etc.) that form hydrogen bonds or an intrinsically ER-active material such as polyaniline or other conductive polymer, can be optionally applied to the surface of the particles to control the surface conductivity of the particles and enhance the ER effect. In other embodiments, the ER particles can be coated with a polymer such as polystyrene (PS), polymethacrylate (PMMA) or polyvinylpyrrolidone (PVP), and functionalized with carboxylic or amine groups to form a charged surface on the ER particles that is the same as the substrate such that the ER particles are repelled by the substrate and easier to remove.

The ER particles can be in the form of a powder, fibers, spheres, rods, core-shell structures, and the like. The ER particles can also be designed to be plate-shaped such that shear is due to the lever action. The size and shape(s) of the ER particles can be varied according to residual particles to be removed, and for effective substrate cleaning and removal of residual particles without damaging the substrate or the structures and materials on the substrate. Generally, the ER particles will have a size (e.g., diameter) that is larger than the residual particles to be removed from the substrate. In embodiments of the invention, the size of the ER particles are larger than the residual particles by a factor of about 10, i.e., about ten times (10×) the size of the residual particles to be removed. In some embodiments, the size of the ER particles can be over a range of about 0.1-100 µm, e.g., about 1-60 µm, about 10-30 µm, etc. For example, to remove contaminant residual particles with a diameter of about 5-10 µm, the average particle size of the ER particles can be about 50-100 µm. As another example, where residual particles are smaller at about 0.05-2 µm, the ER particles can be about 0.5-20 µm in size (i.e., 10× larger).

The volume fraction (concentration) of ER particles in the ER fluid should be sufficient to provide the desired electrorheological effect or performance at the applied electric field. The concentration of ER particles is such that the particles can be maintained as a dispersion in the base fluid but not so high that sedimentation or settling occurs, and low enough to allow the ER fluid to maintain a relatively low viscosity for handling in the absence of an applied field (zero-field viscosity). In embodiments of the invention, the ER particles can be included in the ER fluid at a concentration over a range of about 2-90% by weight of the total composition, and in some embodiments at about 60-80% by weight, about 20-60% by weight, about 30-50% by weight, etc. The weight percentages of the ER particles can be adjusted according to the density of the fluid phase, and/or the density of the particles can be matched with a base fluid for dispersion of particles within the ER fluid.

Optionally, the ER fluid can contain typically used additives including, for example, antioxidants, and surfactants or dispersing agents (dispersants) to increase the conductivity of the ER particles and to maintain a uniform dispersion and prevent agglomeration of the ER particles, at about 0.4-10% by weight of the fluid, or about 0.5-6% by weight. Surfactants can be added directly to the base liquid or as a coating on the surface of the ER particles. Examples of surfactants include block copolymers dedecyl alcohol, fatty acids and amines, glycerol, glycerol esters, glycerol monooleates, hydrocarbon polymers, sodium oleate, tin oxide, among others. The ER fluid can also include a low molecular weight polar compound (dielectric constant (k) of greater than 5) as an activator that generally interacts with the particulate phase predominantly by hydrogen bonding to improve the flow properties and enhance the ER effect, at about 0.4-8% by weight, or about 0.3-5% by weight. Examples of polar compounds include water (up to about 20% by weight), amines (e.g., ethanolamine, ethylenediamine, etc.), amides, nitrites, alcohols, polyhydroxy compounds (e.g., ethylene glycol, glycerol, etc.), low molecular weight esters (e.g., ethyl acetate), carboxylic acids (e.g., acetic acid formic acid, trichloroacetic acid, etc.) and/or other electrolytes such as KCl, LiCl, $LiNO_3$, $CH_3COONa$, $Mg(ClO_4)_2$, NaCl, $ZnCl_2$, $ZnSO_4$, and other organic and inorganic salts of metal ions.

The properties of the ER fluid can be modified by varying the components and concentrations of the ER particles and the base liquid. Generally increasing the concentration of the particles in the fluid or increasing the intensity of the electric field will increase the viscosity of the ER fluid. The properties of the ER fluid can also be modified by the ER particle size and density, the carrier or base fluid properties, additives and temperatures, for example.

The viscosity of the ER fluid can be determined according to known techniques, for example, using a viscometer. The viscosity of the ER fluid can be varied according to the base liquid that is used, from a relatively low viscosity base fluid such as isopropyl alcohol (IPA), acetone and propanol, to a relatively high viscosity base fluid such as an ethylene glycol/sulfuric acid mixture. The viscosity of the ER fluid can also be varied by the type and concentration of the ER particles. For example, acetone having a relatively low no-field viscosity of about 0.306 cP (at 25° C.) can be combined with silica-based ER particles at a concentration of about 0.4-1% by weight to maintain a relatively low viscosity ER fluid, or with titanate-based ER particles such as strontium titanate at the same concentration to provide a higher viscosity ER fluid.

In other embodiments, the ER fluid can be formulated as a homogeneous fluid without particles, for example, as an oil-in-oil emulsion, or liquid crystal polymer dispersed in an insulating oil, such as polyvinyl alcohol (PVA) in Vaseline oil, liquid crystalline polysiloxanes diluted in polydimethylsiloxane (DMS), fluorine compounds in an electrically insulating medium, among others. Homogeneous ER fluids are formulated to change viscosity in response to an electric field, which can be utilized to shear particles from a substrate surface. Examples of homogeneous ER fluids that can be utilized in embodiments of the invention are described, for example, in U.S. Pat. No. 5,891,356 (Unoue et al.) and U.S. Pat. No. 5,374,367 (Edamura).

Figure 2:
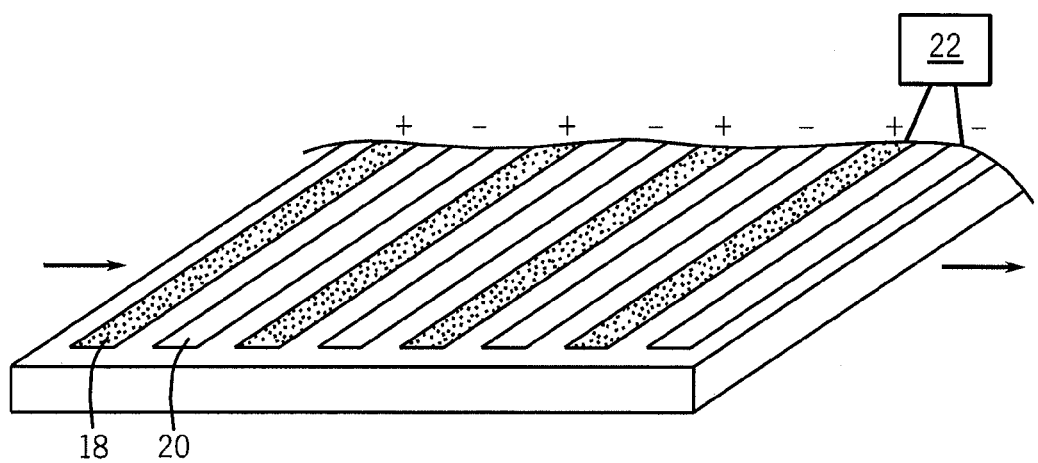
FIG. 2 is an isometric view of the apparatus shown in FIG. 1, taken along lines 2-2.

FIGS. 1-2 depict an embodiment of an apparatus, designated generally as 10, which can be utilized in embodiments of the invention for applying an ER fluid to a substrate (26) to be processed, which is a wafer in the present example. The apparatus 10 generally includes a containment vessel 12 with a lid 12a for receiving and containing an ER fluid therein, an inlet 14 and an outlet 16 for passage of the ER fluid into and out of the vessel 12, electrodes 18, 20 connected to a power source (shown schematically as 22 connected to two electrodes) to provide positive and negative potential, and a support 24 for a substrate 26 (e.g., wafer).

The apparatus 10 can be connected to other processing units/systems, for example by a conveyor mechanism (not shown) for conducting the substrate 26 through a processing system, including a pre-cleaning apparatus and/or a post-cleaning apparatus (not shown). The various units can be electrically coupled to a microprocessor, which may be programmed to carry out particular functions as is known in the art. A pre-cleaning apparatus can be designed to physically loosen up particles from the substrate by means of undercutting or etching of the substrate, which can be performed, for example, by a Standard Clean 1 (SC1) clean or dilute hydrofluoric acid (DHF) clean, typically to a depth of about 0.1-0.5 angstroms. This can serve to lower the shear forces required by the ER fluids for cleaning. A post-cleaning can then be applied to remove the ER particles.

The containment vessel 12 and lid 12a of the apparatus 10 can be composed of an insulating material such as glass, plastic, and polyvinylidene fluoride (PVDF), and define a parallel-plate channel for the flow of the ER fluid. In the illustrated embodiment, a plurality of metallic strip electrodes 18, 20 are formed on the surface of the containment vessel 12 (or the lid) for generating an electric field, and extend transversely or parallel to the direction of flow of the ER fluid (arrow →). In the illustrated embodiment, the electrodes are situated on the surface of the vessel to provide a parallel field configuration and a series of equidistantly spaced (e.g., an about 1 mm gap), alternately negative (−) and positive (+) charged electrodes (anode, cathode). The electrodes can be composed of a conductive metal or metal alloy, for example, aluminum, silver, gold, titanium, tungsten, titanium-tungsten alloy, tantalum, platinum, copper, refractory metal silicide, or alloys thereof, or other suitable electrically conductive material. The electrodes can be formed on or embedded in the surface of the containment vessel 12 (or the lid), using known methods in the art, for example, by chemical vapor deposition (CVD), screen printing, stenciling, electroplating, adhesive attachment of a foil or other conductive material layer (e.g., copper foil about 100 μm thick), or other suitable method of attachment or formation.

The ER fluid is flowed (arrow →) into and through the containment vessel 12 via inlet 14 and outlet 16. As the ER fluid is flowed between the fixed electrodes 18, 20, the flow properties of the ER fluid can be controlled by application of a voltage between the electrodes. The intensity of the applied voltage is generally in the range of about 0.3-6 kV/mm (at 25° C.), or about 0.5-2.5 kV/mm. The applied voltage can be a pulse voltage or continuous voltage.

The viscosity (stiffness) of the ER fluid increases when a voltage is applied between the electrodes caused by the electric field. In the application of the ER fluid, power is generated to the electrodes to provide an electric field of suitable intensity to control the flow of the ER fluid through the containment vessel 12 and the viscosity of the ER fluid to shear residual particles in a lateral direction from the surface of the substrate and trap the loosened residual particles within the ER fluid.

In embodiments of the method, the frequency (intensity) of the applied energy field between the electrodes 18, 20 can be adjusted and controlled to vary the viscosity of the ER fluid during the processing step from a liquid phase to a semi-solid to a solid phase The viscosity of the ER fluid can be increased proportionally with the voltage/current that is applied. The intensity of the applied electric field can also be controlled to vary the rate of change of the viscosity of the ER fluid from a liquid to a semi-solid material to effectively trap the residual particles within the semi-solid ER fluid (which is subsequently removed from the substrate). A pulse voltage can be used to adjust and control the viscosity and flow of the ER liquid. In other embodiments, the frequency of the electric field can be controlled or a pulse voltage can be used to increase the viscosity of the ER fluid from a liquid/fluid state to a semi-solid state to trap residual particles and back to a fluid state to loosen and move residual particles away from lines or other structures situated on the surface, and lessen the pressure imposed upon the structures and allow the structures to relax, unlike the force produced by other techniques such as megasonic or spray cleaning that cannot be readily controlled and modified.

In yet other embodiments, the polarity (+) or (−) of the electrodes 18, 20 can be rapidly changed or pulsed (e.g., by applying a pulse voltage) to cause the ER particles to "rock" and to shear residual particles with a low force. This action provides significantly lower force on residual particles than the actual adhesion force, and provides removal of the particles/contaminants without damage to the structures (e.g., lines, etc.). In other embodiments, the field can be repeatedly varied to repeatedly alter the viscosity of the fluid, e.g., by cyclically or repeatedly applying and terminating the field to increase and decrease the viscosity of the ER fluid between a fluid consistency and a semi-solid consistency. The waveform of the applied field can be optimized to remove the contaminant particles without damage of device structures. For example, resonant frequency of the device structure can be avoided such that a damage free regime is found for contaminant removal.

It is believed that under the influence of an external electric field, the initially unordered ER particles in a particle dispersion type ER fluid undergo dielectric polarization to orient and form a chain or column structure between the electrodes, whereby shear stress (sheer resistance) of the ER fluid is increased resulting in an increase in viscosity of the ER fluid from a liquid state to a solid-like state. The solid ER fluid returns to liquid when the electric field is removed due to the ER particles returning to an unorganized and suspended state within the base fluid. For homogeneous ER fluids, it is believed that molecules of the crystal phase material orient in one direction due to the electric field, whereby shear stress of the ER fluid is increased resulting in an increase in viscosity.

Figure 3:
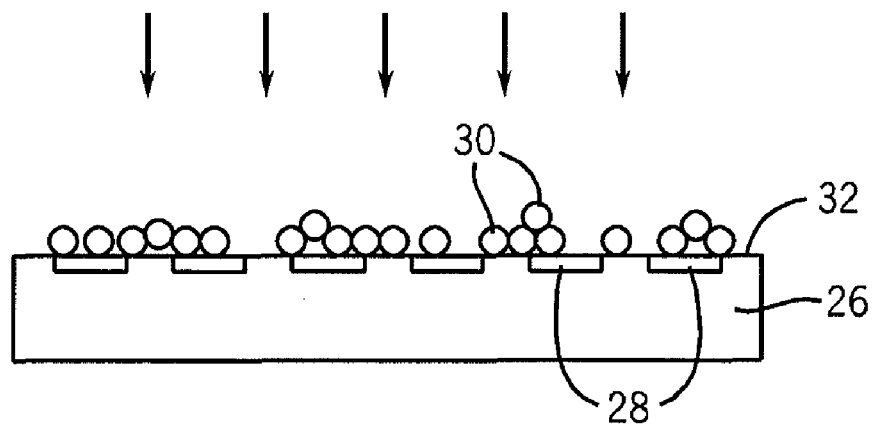
FIG. 3 is an elevational, cross-sectional view of a substrate at a preliminary processing stage according to an embodiment of the present disclosure.

An embodiment of a method according to the invention for removing particulate contaminants from a substrate 26 (e.g., wafer) is described with reference to FIGS. 3-8. The substrate 26 can comprise structures such as lines, DRAM, STI structures, contacts, containers and other features. As shown in FIG. 3, features such as lines 28 of a material such as oxide, polysilicon, carbon, resist, or other hard mask material, have been fabricated on the substrate 26 according to a semiconductor processing step. Residual particles 30 such as oxide, nitride, polysilicon (silicon), carbon, polymer resist, metals (e.g., W, $WSi_x$, TiN, etc.) etc., remain adhered to the surface 32 of the substrate. The composition of the substrate 26 and the residual particles 30 will, at least in part, determine the ultimate strength of the adhesion of the residual particles to the substrate surface 32.

Figure 4:
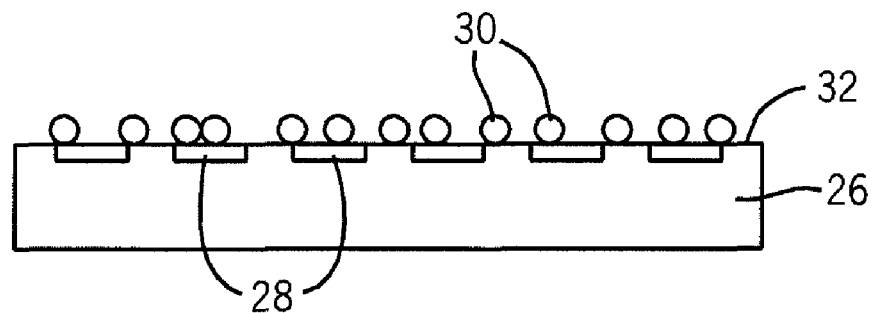
FIGS. 4-8 are cross-sectional views of the substrate of FIG. 3 at subsequent processing steps according to an embodiment of the invention.

In a preliminary step shown in FIG. 3, a conventional pre-clean procedure using a cleaning solution (arrows ↓) comprising, for example, citric acid, ammonium fluoride, surfactants, phosphoric acid, sulfuric acid, hydrofluoric acid, or an ammonia-peroxide mixture (e.g., SC1 clean), can first be conducted to loosen and displace the residual particles 30 from attachment to the substrate surface 32 by etching a portion of the substrate, followed by a rinse (e.g., DI rinse). Following the pre-clean step, loosened residual particles 30 remain attached to the substrate surface 32, as depicted in FIG. 4.

Figure 5:
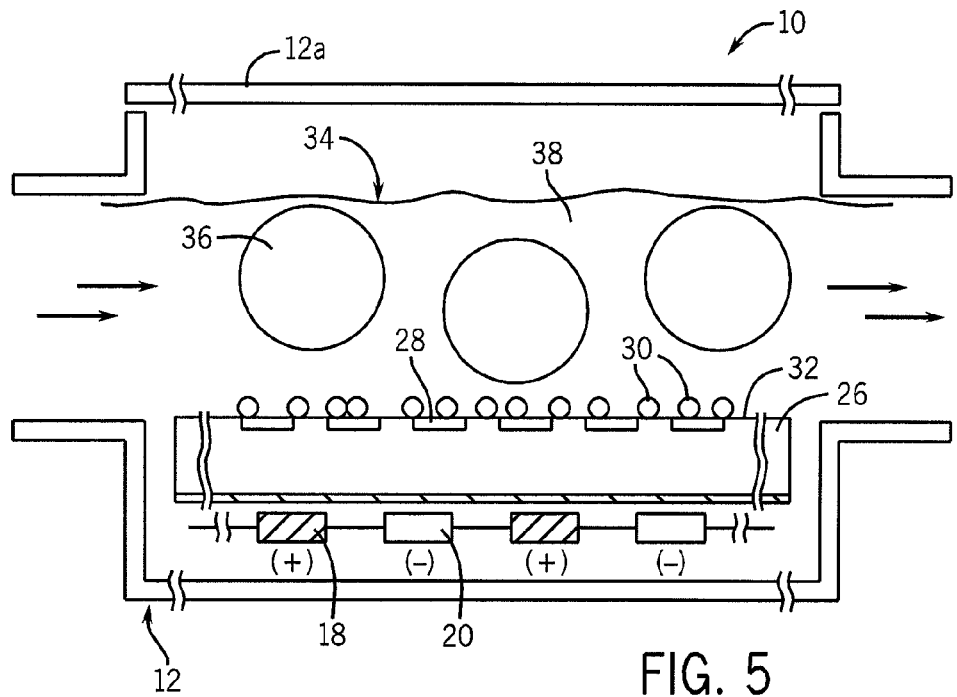

As illustrated in FIG. 5, the substrate 26 is then placed into an apparatus 10 as described, for example, with reference to FIGS. 1-2, for application of an ER fluid to remove remaining residual particles from the surface of the substrate. With the substrate 26 positioned on the support 24, an ER fluid 34 can be introduced into the containment vessel 12, which, in the illustrated embodiment is composed of ER particles 36 dispersed in a carrier or base fluid 38. Typical process parameters for applying the ER fluid include an ER fluid temperature and a substrate (wafer) temperature of about 20-27° C., or about 30-50° C.

Figure 6:
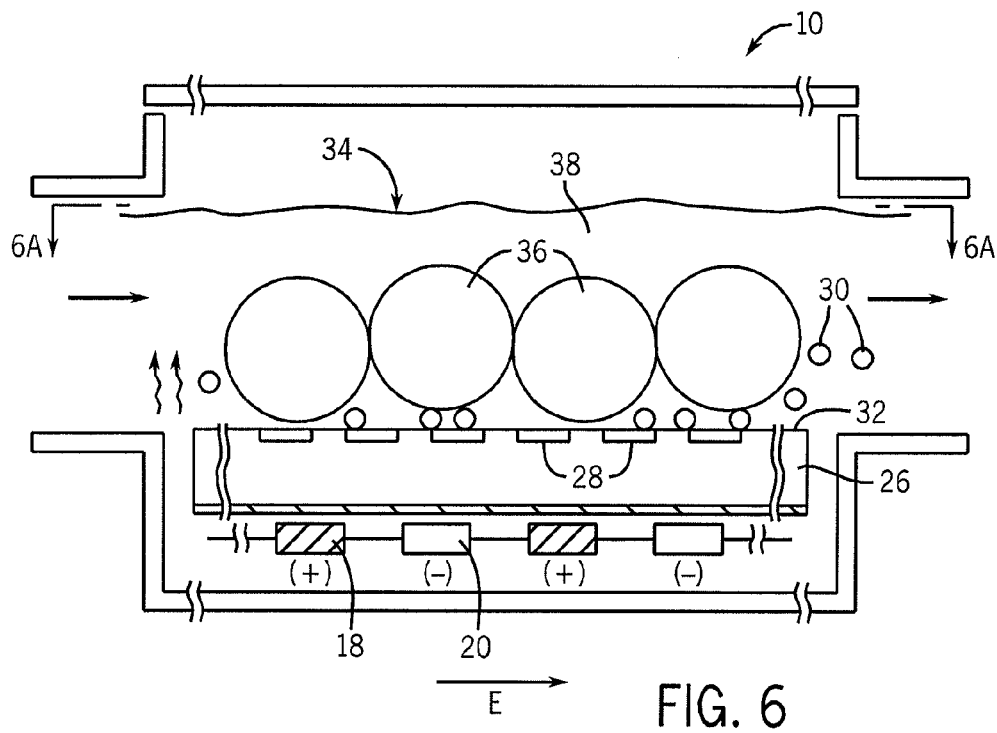
Figure 6A:
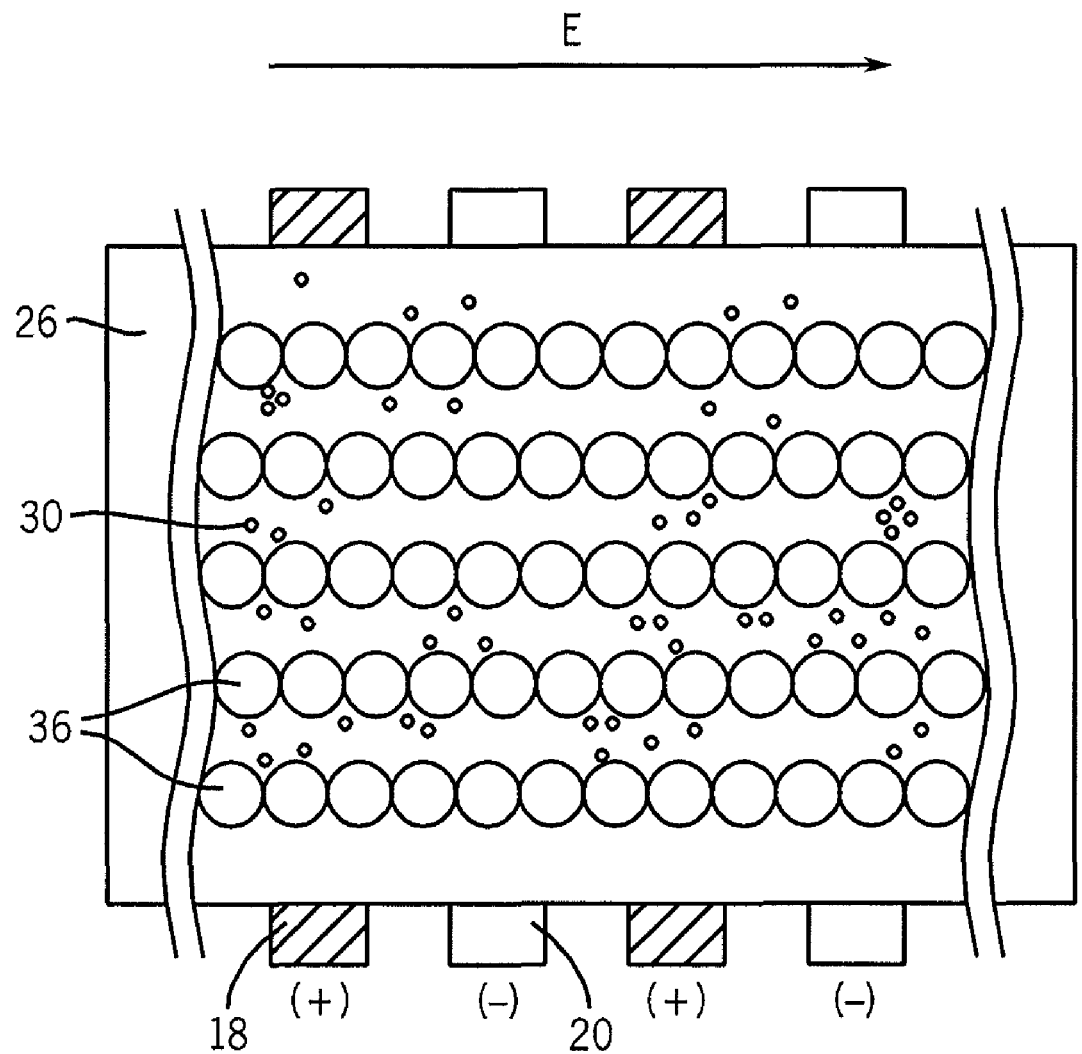

In the application of the ER fluid 34, power is generated to the electrodes 18, 20 as shown in FIG. 6, to generate an electric field (arrows ↑↑) of suitable intensity to cause the viscosity of the ER fluid 34 to increase and trap the loosened residual particles 30 within the ER fluid. As depicted in FIG. 6A, under the influence of the external electric field, the unordered particles 36 orient and attract each other to form particle chains in the fluid along the field lines (arrow E) and provide a shear force over the surface 32 of the substrate 26. Due to the pre-clean application of the cleaning fluid and rinse (FIG. 3), the amount of shear force required in the application of the ER fluid to remove the residual particles 30 can be reduced significantly compared to conventional forces such as megasonic energy or spraying, and in terms of the force applied to contaminants 30 versus device structures 28 to enable damage-free cleans.

Figure 7:
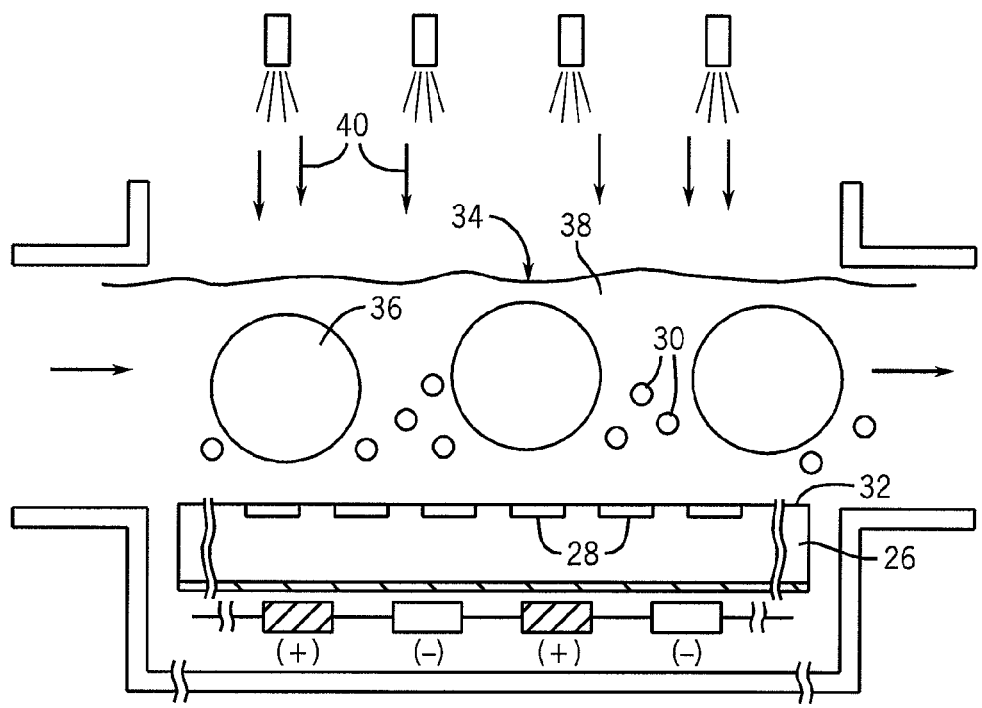

The field is then turned off causing the ER fluid 34 to revert to a liquid form with the ER particles 36 and residual/contaminant particles 30 suspended within the fluid, as illustrated in FIG. 7. The ER fluid 34 containing the residual particles 30 can then be removed from the substrate 26, for example, by applying a rinse water or other aqueous medium (arrows ↓ 40) under non-damaging conditions by dispensing, by aerosol spraying, or by megasonic rinsing.

Figure 8:
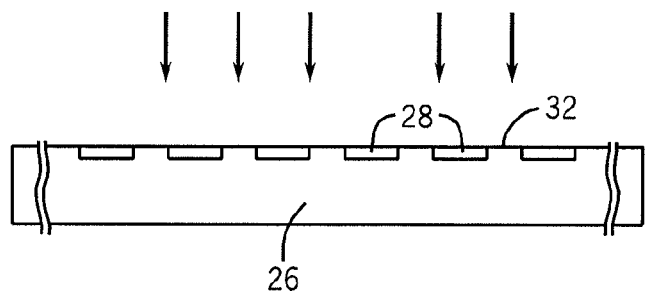

As illustrated in FIG. 8, after removal of the ER fluid 34, a post clean procedure (arrows ↓↓) can be conducted, to remove remnants of the ER fluid 34 including residual particles 30 or ER particles 36 that remain on the substrate surface 32. The ER particles 36 generally have a larger diameter than the residual particles 30 and can be readily removed, for example, through the use of an SC1 clean or DHF clean (e.g., about 500:1 water:HF) in conjunction with a spray or megasonic system, followed by water rinse. In embodiments in which the ER particles 36 are coated with a polymer (e.g., PMMA, PVP, PS, etc.) and functionalized with a reactive group (e.g., carboxylic or amine group) which provides a charged surface that is the same as the substrate, the ER particles 36 are repelled by the surface and easier to remove by rinsing.

Application of the ER fluid traps and effectively removes the residual particles leaving a cleaned surface 32, as depicted in FIG. 8, while maintaining and preserving the integrity of the lines 28 (or other structure) present on the substrate 26. Subsequent processing of the substrate and features may then be conducted as known in the art.

Figure 9:
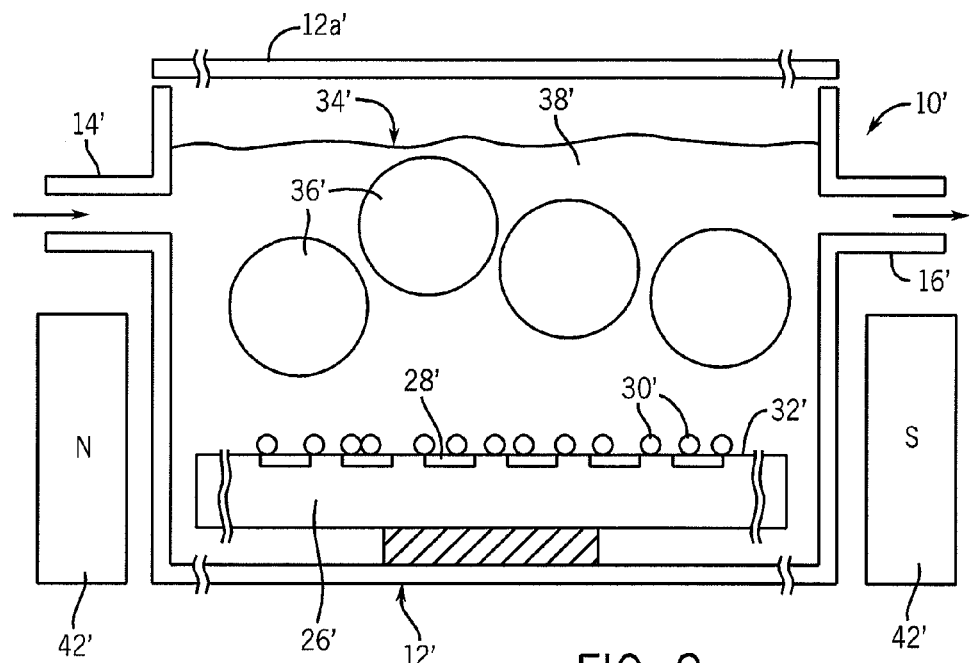
FIG. 9 is an elevational, cross-sectional view of a substrate at a preliminary processing stage according to another embodiment of the present disclosure.
Figure 10:
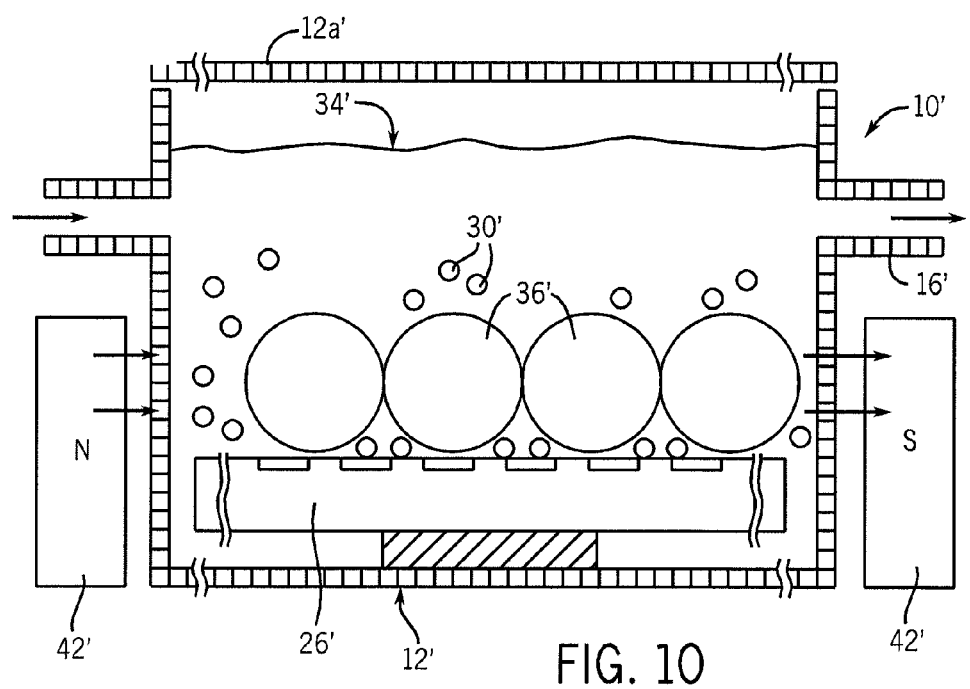
FIGS. 10-11 are cross-sectional views of the substrate of FIG. 9 at subsequent processing steps.
Figure 11:
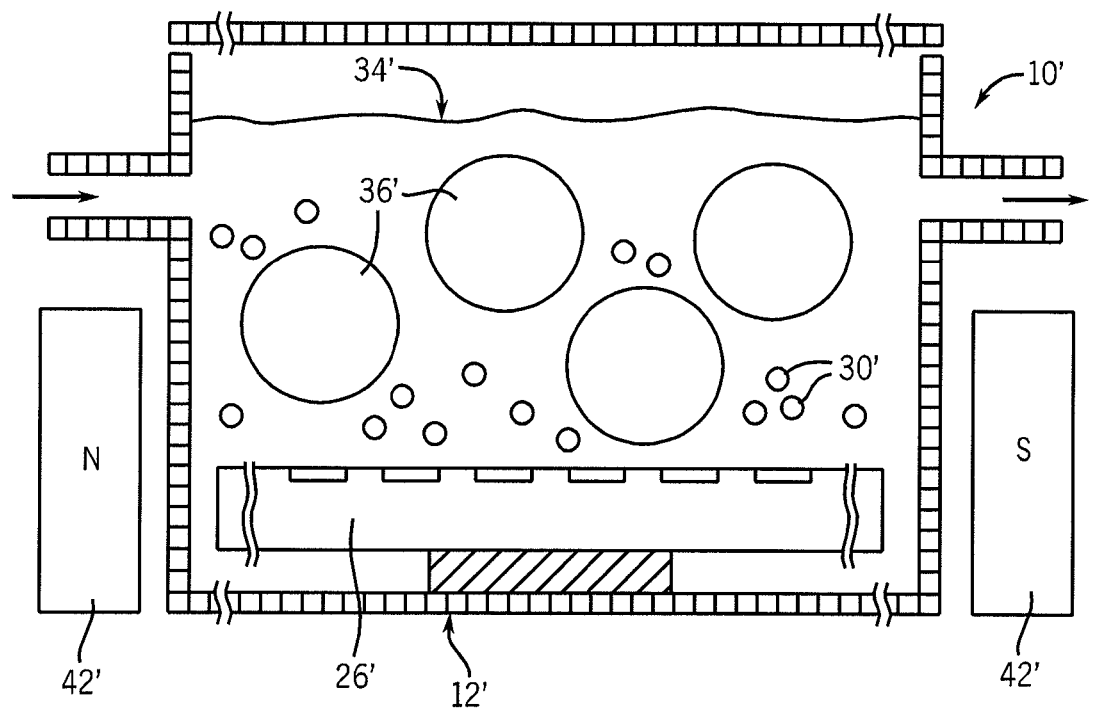

In another embodiment of the invention illustrated in FIGS. 9-11, a magnetorheological (MR) fluid can be used to remove particulates/contaminants from the substrate. MR fluids are fluids that undergo a rapid increase in viscosity in the presence of a magnetic field, which is reversible. MR fluids are composed of a suspension of magnetic or magnetizable particles in an base or carrier fluid such as the base liquids described herein for the ER fluids, e.g., a hydrocarbon oil, silicone oil, etc.

The magnetizable (MR) particles of an MR fluid are typically composed of magnetically soft ferro- or ferromagnetic or paramagnetic compounds. The MR particles can be in the form of a powder, fibers, spheres, rods, plates, core-shell structures, and the like. Examples of magnetizable particles include particles composed of materials such as iron, iron oxide, iron nitride, iron carbide, carbonyl iron, chromium dioxide, low carbon steel, silicon steel, nickel, cobalt, etc., or a combination or alloys of such materials (e.g., Fe—Co alloys, Fe—Ni alloys, Mn—Zn ferrite, Ni—Zn ferrite), and ceramic ferrites. In other embodiments, the MR particles are magnetic composite particles with a polymer core (e.g., polystyrene-acetoacetoxyethyl methacrylate (PS-AAEM)) coated with a magnetic material (e.g., magnetite), as described, for example, in Choi et al., *IEEE Transactions on Magnetics* 41(10): 3448-3450 (2005). In other embodiments, the MR particles are composed of a magnetic material core (e.g., magnetite) coated with a polymer material (e.g., styrene-divinylbenzene copolymer). See, for example, US 2007/0023247 to Ulicny et al., and U.S. Pat. No. 5,382,373 to Carlson et al., and U.S. Pat. No. 6,682,660 to Sucholeiki et al.

The size and shape(s) of the MR particles can be varied, as described with respect to the ER fluid, according to residual particles to be removed, and for effective substrate cleaning and removal of residual particles without damaging the substrate or the structures and materials on the substrate. The MR particles will generally have a size (e.g., diameter) that is larger than the residual particles to be removed from the substrate, and in embodiments of the invention, the size of the MR particles is larger than the residual particles by a factor of about 10 (i.e., about ten times (10×) the size of the residual particles). In some embodiments, the size of the MR particles can be over a range of about 0.1-100 µm, e.g., about 1-60 µm, about 10-30 µm, etc. For example, to remove contaminant residual particles with a diameter of about 5-10 µm, the average particle size of the MR particles can be about 50-100 µm. As another example, where residual particles are smaller at about 0.05-2 µm, the MR particles can be about 0.5-20 µm in size (i.e., 10× larger).

The volume fraction (concentration) of ER particles in the ER fluid should be sufficient to provide the desired magnetorheological effect or performance at the applied magnetic field. The concentration of MR particles is such that the particles can be maintained as a dispersion in the base fluid but not so high that sedimentation or settling occurs, and low enough to allow the MR fluid to maintain a relatively low viscosity for handling in the absence of an applied field (zero-field viscosity). Generally, the concentration of MR particles in the MR fluid can be over a range of about 2-90% by weight of the total composition, and in some embodiments at about 60-80% by weight, about 20-60% by weight, about 30-50% by weight, etc. The weight percentage of the MR particles can be adjusted according to the density of the fluid phase, and/or the density of the particles can be matched with a base fluid for dispersion of particles within the MR fluid.

The MR fluid can optionally include additives such as those described herein for the ER fluid, for example, surfactants and silica composites to enhance the dispersion stability of the MR fluid against sedimentation and aggregation of the MR particles.

An embodiment of a MR fluid apparatus 10' is illustrated in FIG. 9, which includes a magnetic field generator 42', which can be a magnet or an electromagnet (connected to a power source (not shown)), to activate the MR fluid 34'. The apparatus 10' also includes a containment vessel 12' (shown with a lid 12a') for containing the MR fluid 34' with an inlet 14' and an outlet 16'. In some embodiments, the apparatus 10' (or 10) can be designed such that the direction of the flow of the rheological fluid is perpendicular to the field or flux lines. An insulator (not shown) can be used to block or shield the magnetic field generator 42' and thereby inactivate the MR fluid to a viscous state.

Removal of particulate contaminants from a substrate using an MR fluid is similar to the above-describe processing using an ER fluid with reference to FIGS. 3-8. In brief, a substrate 26' can undergo a pre-clean step (FIG. 3) to loosen and displace the residual particles 30' from the substrate surface 32'. The pre-cleaned substrate 26' can then be placed into an MR apparatus, for example apparatus 10' as illustrated in FIG. 9, and an MR fluid 34' can be introduced into the containment vessel 12'. When an MR fluid is exposed to a sufficiently high magnetic field (arrows →) from the magnetic field generator 42', the magnetic MR particles 36' within the MR fluid 34' become polarized and organize (coalesce) into chains or bands of particles in the direction of the field or flux lines (e.g., as depicted in FIG. 6A), which acts to restrict the movement of the fluid and to increase the viscosity or flow resistance of the MR fluid, e.g., from a gel to a near solid or viscoelastic material. The MR particles 36' and fluid 38' provide a shear force in a lateral direction over the substrate 26' to loosen the residual particles 30' from the surface 32' and trap the particles 30' within the MR fluid. As depicted in FIG. 11, the MR fluid 34' can then be changed to a liquid form by turning off the magnetic field.

The MR fluid 34' can be removed by rinsing with an aqueous medium (e.g., water) (e.g., FIG. 7), and a post clean can then be conducted (FIG. 8) to remove remnant MR fluid including MR particles 36' and residual particles 30' from the substrate, leaving a cleaned surface 32'. Subsequent processing of the substrate and features may then be conducted as desired.

Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations that operate according to the principles of the invention as described. Therefore, it is intended that this invention be limited only by the claims and the equivalents thereof. The disclosures of patents, references and publications cited in the application are incorporated by reference herein.

What is claimed is:

1. A method for cleaning a surface of a semiconductor substrate having residual particles thereon comprising:
   applying a magnetorheological or electrorheological fluid having a fluid consistency onto the substrate;
   applying a field to increase viscosity of the rheological fluid up to a viscoelastic, semi-solid but not solid consistency such that said residual particles are suspended within the semi-solid rheological fluid, wherein the field is a magnetic field when a magnetorheological fluid is applied and the field is an electric field when an electrorheological fluid is applied;
   decreasing the field to decrease the viscosity of the magnetorheological or electrorheological fluid; and
   removing the magnetorheological or electrorheological fluid from the substrate with the residual particles suspended within the magnetorheological or electrorheological fluid.

2. The method of claim 1, wherein applying the field comprises repeatedly applying and terminating the field whereby the viscosity of the magnetorheological or electrorheological fluid is increased and decreased a plurality of times.

3. The method of claim 1, wherein applying the field comprises cyclically applying and terminating the field to increase and decrease viscosity of the magnetorheological or electrorheological fluid a plurality of times.

4. The method of claim 1, wherein applying the field comprises repeatedly varying the field to modify the viscosity of the magnetorheological or electrorheological fluid between a fluid consistency and a semi-solid consistency a plurality of times.

5. The method of claim 1, wherein applying the field comprises repeatedly increasing the field to increase the viscosity of said magnetorheological or electrorheological fluid and decreasing the field to decrease the viscosity such that said viscosity is increased and decreased a plurality of times.

6. The method of claim 1, wherein applying the field comprises applying a pulse voltage to increase and decrease viscosity of the magnetorheological or electrorheological fluid a plurality of times between the fluid consistency and the semi-solid consistency.

7. The method of claim 1, further comprising, prior to applying the magnetorheological or electrorheological fluid, exposing the surface of the substrate to a cleaning agent.

8. The method of claim 1, further comprising, after removing the magnetorheological or electrorheological fluid, applying a cleaning agent to remove residual particles of the magnetorheological or electrorheological fluid from the substrate.

9. A method for cleaning a surface of a semiconductor substrate having contaminant particulates thereon, comprising:
   applying a magnetorheological or electrorheological fluid having a fluid consistency onto the substrate;
   applying a field to increase viscosity of the rheological fluid up to a viscoelastic, semi-solid but not solid consistency to loosen the contaminant particulates from the surface of the substrate, wherein the field is a magnetic field when a magnetorheological fluid is applied and the field is an electric field when an electrorheological fluid is applied;
   decreasing the field wherein said loosened contaminant particles are suspended in the magnetorheological or electrorheological fluid; and
   removing the magnetorheological or electrorheological fluid with said loosened contaminant particles from the substrate suspended therein.

10. The method of claim 9, wherein the magnetorheological or electrorheological fluid comprises electrorheological or magnetorheological particles having a size about ten times greater than the contaminant particles.

11. The method of claim 9, wherein applying the field comprises cyclically applying and terminating the field to repetitively increase and decrease viscosity of the magnetorheological or electrorheological fluid a plurality of times.

12. A method for cleaning a surface of a semiconductor substrate having residual particulates thereon, comprising:
   applying a magnetorheological or electrorheological fluid having a fluid consistency onto the substrate;
   applying a field to increase viscosity of the rheological fluid up to a viscoelastic, semi-solid but not solid consistency, wherein the field is a magnetic field when a magnetorheological fluid is applied and the field is an electric field when an electrorheological fluid is applied;
   repeatedly decreasing and increasing the field to repeatedly vary the viscosity of the magnetorheological or electrorheological fluid from a fluid to up to a semi-solid consistency a plurality of times wherein at least a portion of the particulates are suspended within the magnetorheological or electrorheological fluid; and,
   removing the magnetorheological or electrorheological fluid with said particulates from the substrate suspended therein.

13. A method for cleaning a surface of a semiconductor substrate, comprising: applying an electrorheological fluid to the surface of the substrate having residual particulates thereon;
   applying an electrical field to increase viscosity of the electrorheological fluid up to a viscoelastic, semi-solid but not solid consistency such that the particulates are suspended therein;
   decreasing the electrical field such the electrorheological fluid is a fluid consistency and the residual particulates are suspended therein; and
   removing the electrorheological fluid from the substrate with said residual particulates suspended therein.

14. The method of claim 13, wherein the electrorheological fluid comprises electrorheological particles dispersed within an insulating fluid.

15. The method of claim 14, wherein the electrorheological particles comprise a surface with an activator material thereon, the activator material comprising an organic compound or amine capable of forming hydrogen bonds.

16. The method of claim 14, wherein the electrorheological particles comprise a surface with a conductive polymer applied thereon.

17. The method of claim 16, wherein the conductive polymer comprises polyaniline.

18. The method of claim 14, wherein the electrorheological particles are coated with a polymer selected from the group consisting of polystyrene, polymethacrylate and polyvinylpyrrolidone, said polymer functionalized with carboxylic or amine group.

19. The method of claim 13, wherein the electrorheological fluid comprises a liquid crystal polymer dispersed in an insulating fluid.

20. The method of claim 13, wherein the electrorheological fluid comprises a homogenous fluid without electrorheological particles, said homogenous fluid selected from the group consisting of polyvinyl alcohol in oil, and liquid crystalline polysiloxane in polydimethylsiloxane.

21. A method for cleaning a surface of a semiconductor substrate, comprising: applying a magnetorheological fluid to the surface of the substrate having residual particulates thereon;
   applying a magnetic field to increase viscosity of the magnetorheological fluid up to a viscoelastic, semi-solid but not solid consistency such that the residual particulates are suspended therein;
   decreasing the magnetic field such the magnetorheological fluid is a fluid consistency and the residual particulates are suspended therein; and
   removing the magnetorheological fluid from the substrate with said residual particulates suspended therein.

22. The method of claim 21, wherein the magnetorheological fluid comprises magnetorheological particles composed of a polymer core coated with a magnetic material.

23. The method of claim 21, wherein the magnetorheological fluid comprises magnetorheological particles composed of a magnetic material core coated with a polymer material.

* * * * *

UNITED STATES PATENT AND TRADEMARK OFFICE
CERTIFICATE OF CORRECTION

PATENT NO. : 7,981,221 B2
APPLICATION NO. : 12/035008
DATED : July 19, 2011
INVENTOR(S) : Nishant Sinha It is certified that error appears in the above-identified patent and that said Letters Patent is hereby corrected as shown below:

In column 12, lines 4-16, in Claim 13,
delete "A method for cleaning a surface of a semiconductor substrate, comprising: applying an electrorheological fluid to the surface of the substrate having residual particulates thereon;
  applying an electrical field to increase viscosity of the electrorheological fluid up to a viscoelastic, semi-solid but not solid consistency such that the particulates are suspended therein;
  decreasing the electrical field such the electrorheological fluid is a fluid consistency and the residual particulates are suspended therein; and
  removing the electrorheological fluid from the substrate with said residual particulates suspended therein." and
insert -- A method for cleaning a surface of a semiconductor substrate, comprising:
  applying an electrorheological fluid to the surface of the substrate having residual particulates thereon;
  applying an electrical field to increase viscosity of the electrorheological fluid up to a viscoelastic, semi-solid but not solid consistency such that the particulates are suspended therein;
  decreasing the electrical field such that the electrorheological fluid is a fluid consistency and the residual particulates are suspended therein; and
  removing the electrorheological fluid from the substrate with said residual particulates suspended therein. --, therefor.

In column 12, line 12, in Claim 13, delete "such the" and insert -- such that the --, therefor.

In column 12, lines 42-54, in Claim 21,
delete "A method for cleaning a surface of a semiconductor substrate, comprising: applying a magnetorheological fluid to the surface of the substrate having residual particulates thereon;
  applying a magnetic field to increase viscosity of the magnetorheological fluid up to a viscoelastic, semi-solid but not solid consistency such that the residual particulates are suspended therein;
  decreasing the magnetic field such the magnetorheological fluid is a fluid consistency and the residual particulates are suspended therein; and Signed and Sealed this
Seventh Day of February, 2012

David J. Kappos
*Director of the United States Patent and Trademark Office*

CERTIFICATE OF CORRECTION (continued)

U.S. Pat. No. 7,981,221 B2 removing the magnetorheological fluid from the substrate with said residual particulates suspended therein." and insert -- A method for cleaning a surface of a semiconductor substrate, comprising:

applying a magnetorheological fluid to the surface of the substrate having residual particulates thereon;

applying a magnetic field to increase viscosity of the magnetorheological fluid up to a viscoelastic, semi-solid but not solid consistency such that the residual particulates are suspended therein;

decreasing the magnetic field such the magnetorheological fluid is a fluid consistency and the residual particulates are suspended therein; and removing the magnetorheological fluid from the substrate with said residual particulates suspended therein. --, therefor.